(12) United States Patent
Mongia

(10) Patent No.: US 7,336,486 B2
(45) Date of Patent: Feb. 26, 2008

(54) SYNTHETIC JET-BASED HEAT DISSIPATION DEVICE

(75) Inventor: Rajiv K. Mongia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 11/244,498

(22) Filed: Sep. 30, 2005

(65) Prior Publication Data

US 2007/0076375 A1    Apr. 5, 2007

(51) Int. Cl.
  *H05K 7/20*     (2006.01)
  *F28D 15/00*    (2006.01)
  *H01L 23/34*    (2006.01)

(52) U.S. Cl. .............. 361/695; 361/694; 361/718; 165/104.33; 165/908; 257/712; 257/E23.1

(58) Field of Classification Search ............... 165/104.11–109.1, 80.3, 104.33, 908; 361/679–709, 361/694–695, 717–720; 257/706–707, 712–713, 257/E23.1

See application file for complete search history.

(56) References Cited

U.S. PATENT DOCUMENTS

| | | | | |
|---|---|---|---|---|
| 3,968,498 A | * | 7/1976 | Uchiyama | 346/29 |
| 5,758,823 A | * | 6/1998 | Glezer et al. | 239/4 |
| 5,861,703 A | * | 1/1999 | Losinski | 310/330 |
| 5,894,990 A | * | 4/1999 | Glezer et al. | 239/423 |
| 5,991,153 A | * | 11/1999 | Heady et al. | 361/704 |
| 6,029,119 A | * | 2/2000 | Atkinson | 702/132 |
| 6,123,145 A | * | 9/2000 | Glezer et al. | 165/104.33 |
| 6,180,427 B1 | * | 1/2001 | Silverbrook | 438/21 |
| 6,588,497 B1 | * | 7/2003 | Glezer et al. | 165/84 |
| 6,650,542 B1 | * | 11/2003 | Chrysler et al. | 361/699 |
| 6,801,430 B1 | * | 10/2004 | Pokharna | 361/695 |
| 6,937,472 B2 | * | 8/2005 | Pokharna | 361/700 |
| 7,023,697 B2 | * | 4/2006 | Pokharna et al. | 361/695 |
| 2005/0074662 A1 | * | 4/2005 | Cho et al. | 429/38 |
| 2005/0111185 A1 | * | 5/2005 | Bhattacharya et al. | 361/690 |
| 2005/0231914 A1 | * | 10/2005 | Mikubo et al. | 361/699 |
| 2006/0120072 A1 | * | 6/2006 | Dorogi et al. | 362/217 |

FOREIGN PATENT DOCUMENTS

WO    WO 2004017698 A1  *  2/2004

* cited by examiner

*Primary Examiner*—Jayprakash Gandhi
*Assistant Examiner*—Robert J Hoffberg
(74) *Attorney, Agent, or Firm*—Blakely, Sokoloff, Taylor & Zafman LLP

(57) ABSTRACT

A synthetic jet array in a computing device, such as a mobile computing device, to dissipate heat generated by a heat generating component of the mobile computer is described. In one embodiment, a microscale synthetic jet array is integrated within a heat generating component, either on the backside of the heat generating component itself or on a heat spreader coupled to the heat generating component. A method of fabricating a synthetic jet array as an integrated part of a computing device or as a heat spreader is described, as well as a method of use of the synthetic jet array, are described.

5 Claims, 6 Drawing Sheets

SYNTHETIC JET-BASED HEAT DISSIPATION DEVICE

FIELD OF INVENTION

The field of invention relates generally to heat management and more particularly to heat management using synthetic jet-based heat dissipation devices.

BACKGROUND

Heat management can be critical in many applications. Excessive heat can cause damage to or degrade the performance of mechanical, chemical, electric, and other types of devices. Heat management becomes more critical as technology advances and newer devices continue to become smaller and more complex, and as a result run at higher power levels and/or power densities.

Modern electronic circuits, because of their high density and small size, often generate a substantial amount of heat. Complex integrated circuits (ICs), especially microprocessors, generate so much heat that they are often unable to operate without some sort of cooling system. Further, even if an IC is able to operate, excess heat can degrade an IC's performance and can adversely affect its reliability over time. Inadequate cooling can cause problems in central processing units (CPUs) used in personal computers (PCs), which can result in system crashes, lockups, surprise reboots, and other errors. The risk of such problems can become especially acute in the tight confines found inside mobile computers and other portable computing and electronic devices.

Prior methods for dealing with such cooling problems have included using heat sinks, fans, and combinations of heat sinks and fans attached to ICs and other circuitry in order to cool them. However, in many applications, including portable and handheld computers, computers with powerful processors, and other devices that are small or have limited space, these methods may provide inadequate cooling.

Conventional synthetic jet actuators require an acoustic chamber in order to work appropriately. This makes the entire synthetic jet relatively large and difficult to implement within the tight confines of a mobile device such as a notebook computer. Additionally, because of the large size, the distance between the actuator of the convention synthetic jet actuators and the hotspots is significantly large for portable devices because the synthetic jets are incorporated as non-integrated parts that flow air across the hot spots and not directly away from the hot spots.

DETAILED DESCRIPTION

A method and apparatus to use a synthetic jet array in a computing device to absorb heat generated by a heat generating component of a computer is described. In the following description, numerous specific details are set forth. However, it is understood that embodiments may be practiced without these specific details. In other instances, well-known circuits, structures and techniques have not been shown in detail in order not to obscure the understanding of this description.

Reference throughout this specification to "one embodiment" or "an embodiment" indicate that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

A synthetic jet array in a computing device to absorb heat generated by a heat generating component of a computer is described. In one embodiment, a microscale synthetic jet array is integrated within a mobile computing device, either on the backside of the heat generating component within a computing device itself or on a heat spreader coupled to the heat generating component within the computing device. A method of fabricating a synthetic jet array as an integrated part of a heat generating component of a computing device or as a heat spreader is described, as well as a method of use of the synthetic jet array, are described.

Figure 1A:
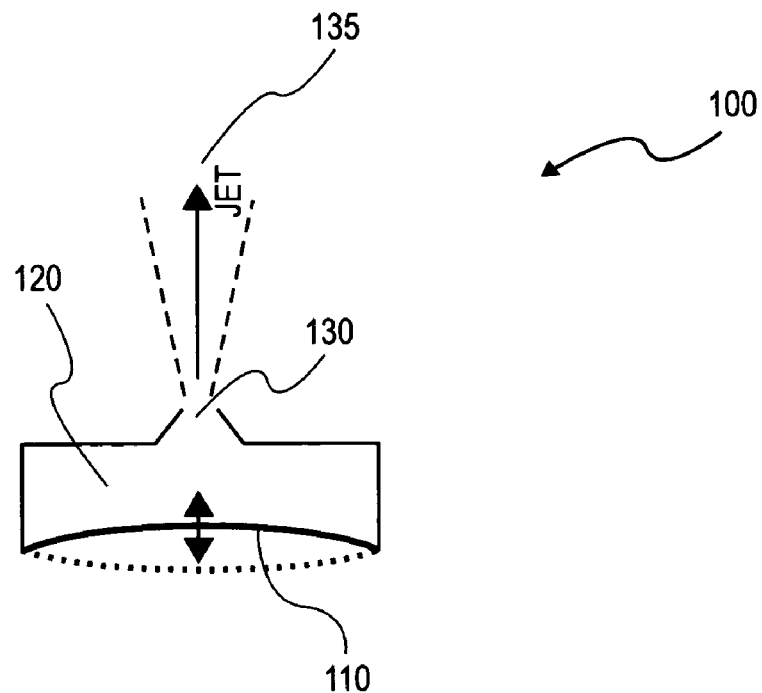
FIG. 1A is an illustration of one embodiment of a cross-section of a microscale synthetic jet.

An apparatus is described that includes a heat generating component of a computing device, such as a mobile computing device, and a microscale synthetic jet having an actuator, a chamber, and an orifice. An embodiment of a microscale synthetic jet 100 is illustrated in cross-section in FIG. 1A. The microscale synthetic jet 100 is formed of an actuator 110, a chamber 120, and an orifice 130 from which the jet of air 135 is periodically expelled. The actuator 110 may be formed of a piezoelectric material that can be mechanically moved by the application of an electrical current or of a radiofrequency. Piezoelectric materials that may be used include zinc oxide (ZnO), quartz ($SiO_2$), and barium titanate ($BaTiO_3$). Alternatively, piezoelectric polymer materials may be used such as polyvinylidene fluoride. In another embodiment, the actuator 110 may be a shape memory material. A jet of air 135 is periodically forced through the orifice 130 to force the hot air away from the surface of the heat generating component into which the microscale synthetic jet is integrated. The heat generating component may be a processor, a chipset, a graphics controller, a memory or any alternative device that generates heat. In one particular embodiment, the heat generating device may be a heat spreader.

Figure 1B:
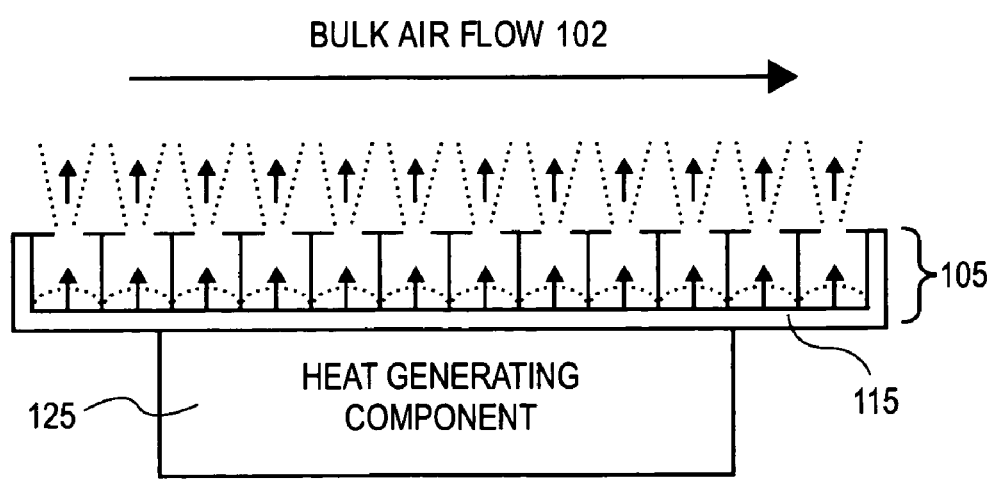
FIG. 1B illustrates an array of microscale synthetic jets integrated within a heat spreader, according to one embodiment.
Figure 1C:
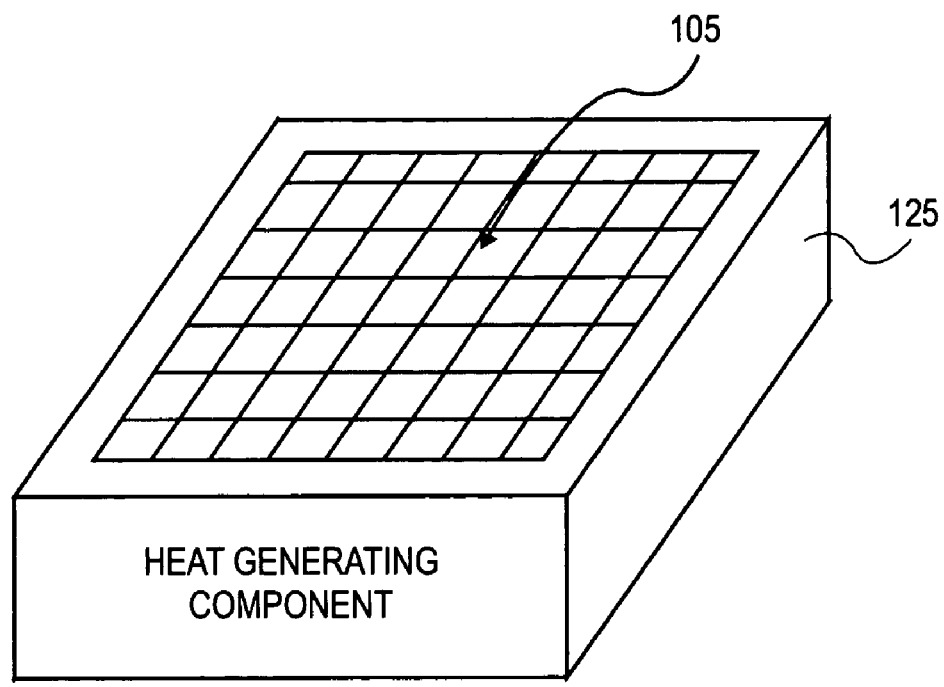
FIGS. 1C and 1D illustrate embodiments of an array of microscale synthetic jets integrated into the backside of a heat generating component.
Figure 1D:
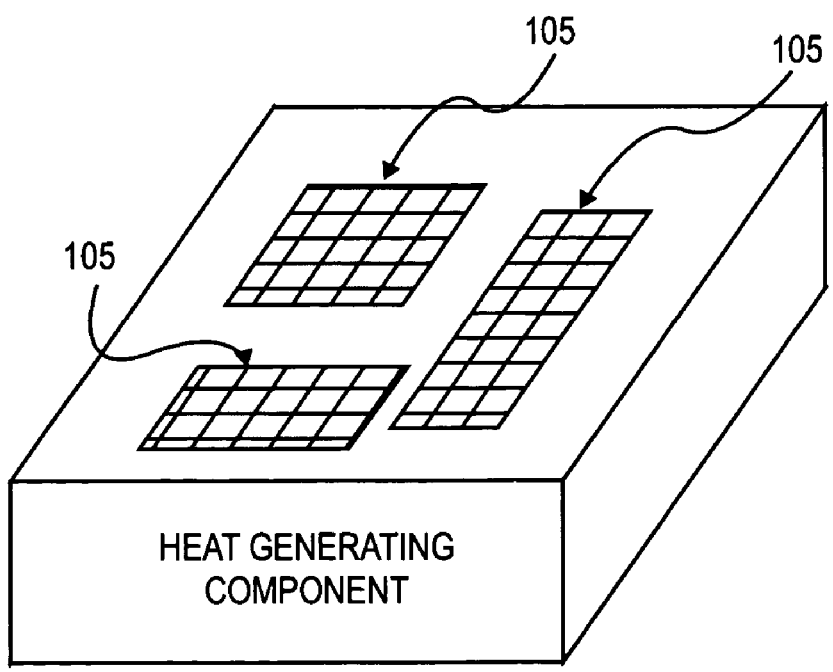

The microscale synthetic jet may be part of an array of microscale synthetic jets. FIG. 1B illustrates a cross-sectional view of an embodiment of a microscale synthetic jet array 105 where the microscale synthetic jet array 105 is formed as an integrated part of a heat spreader 115. In this embodiment, the heat generating component 125 is connected to a heat spreader 115. In one embodiment, a device (not shown) for creating a bulk air flow 102 parallel to the surface of the microscale synthetic jet may be included to further remove the hot air away from the surface of the heat generating component of the computing device. FIGS. 1C and 1D each illustrate examples of a microscale synthetic jet array 105 that has been integrated into a heat generating component of a computing device. In FIG. 1C, a microscale synthetic jet array 105 is formed over substantially the entire backside of the heat generating component 125. FIG. 1D, illustrates an embodiment where the microscale synthetic jet array 105 is formed over hot spots of the heat generating component 125. Bulk air flow may also be used in the embodiments illustrated in FIG. 1C and 1D to further remove hot air away from the surface.

FIGS. 2A-2I illustrate an embodiment of a method of fabricating a microscale synthetic jet array 105 as an integral part of a heat generating component 125 using microscale fabrication techniques. At FIG. 2A a heat generating component 125 is provided. The heat generating component 125 may be a heat spreader or a heat generating device of a computing device. At FIG. 2B an electrode material 200 is deposited onto a surface of the heat generating component. In one embodiment the surface is the backside of the heat generating component 125. The electrode material may be any type of conductive metal such as aluminum or copper. Next, the electrode material 200 may be patterned to form electrodes in positions that will place them in contact with each of the microscale synthetic jets 100 within the array 105 (not illustrated.)

Figure 2A:
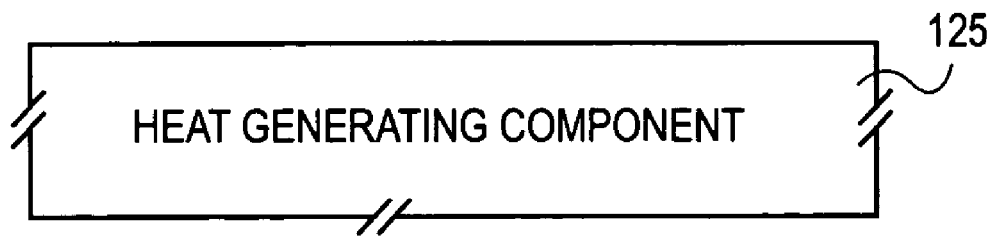
FIGS. 2A-2I illustrate a method of fabricating an array of microscale synthetic jets, according to one embodiment.
Figure 2B:
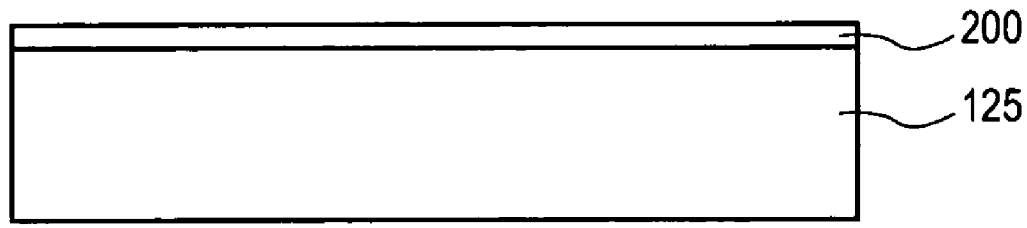
Figure 2C:
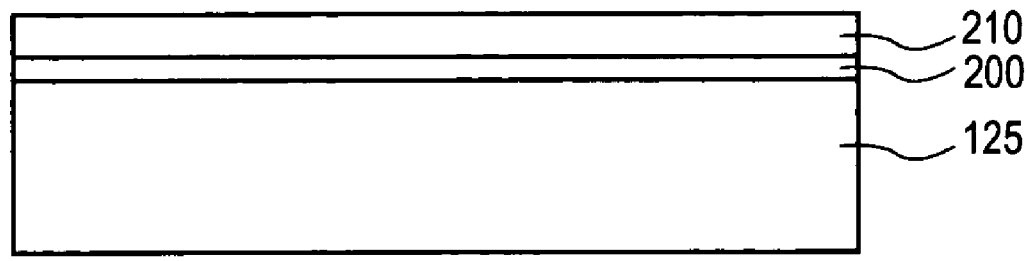

An actuator material 210 may then be formed over the electrode material 200 at FIG. 2C. The actuator material 210 is a material that can be mechanically deformed to act as the actuator within the microscale synthetic jets. Examples of such materials include piezoelectric materials and shape memory materials. The purpose of the electrodes formed by the underlying electrode material 200 are to provide stimulation to cause the mechanical deformation of the actuator material 210. Deposition methods such as chemical vapor deposition (CVD) or physical vapor deposition (PVD) may be used to deposit the actuator material 210.

Figure 2D:
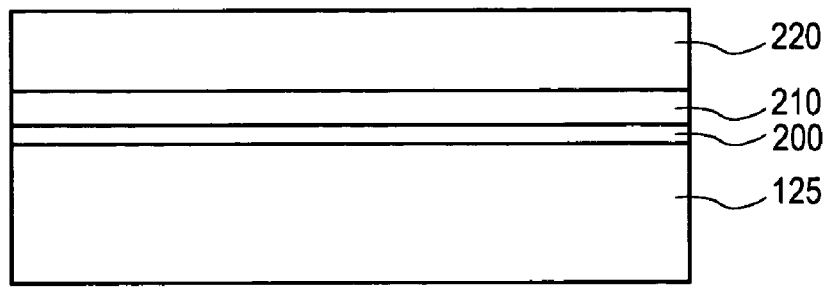

A chamber material 220 is then deposited over the actuator material 210 at FIG. 2D. The chamber material 220 may be silicon or a similar material or alternatively may be a metal. In this particular embodiment the chamber material 220 is silicon. The chamber material 220 may be formed to a thickness sufficient to form the walls of the chamber such that they may form a jet effective to cool the heat generating component 125. Deposition methods such as chemical vapor deposition (CVD) or physical vapor deposition (PVD) may be used to deposit the chamber material 220.

Figure 2E:
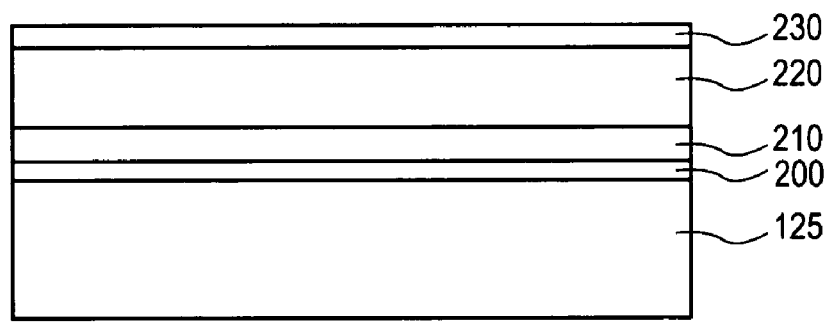
Figure 2F:
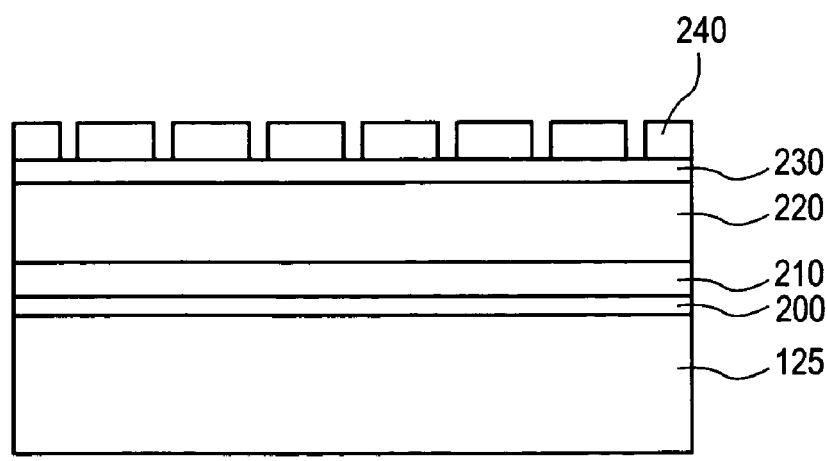
Figure 2G:
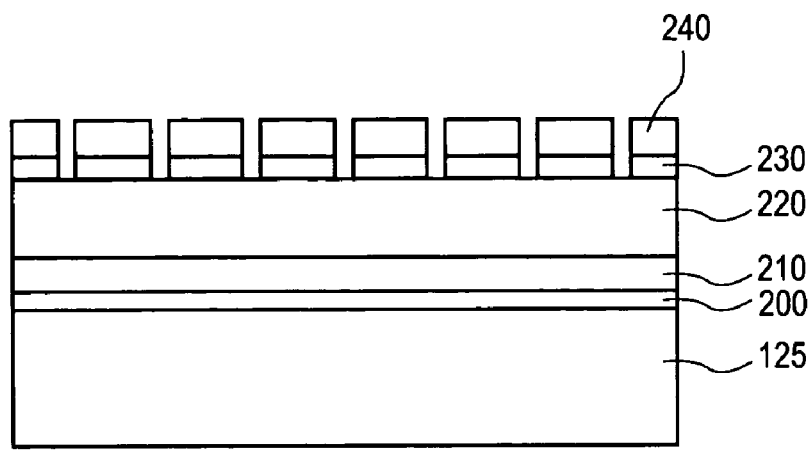

At FIG. 2E a hard mask 230 is formed over the chamber material 220. The hard mask 230 may be formed of a material such as silicon nitride or any similar type of material known to those of ordinary skill in the art. At FIG. 2F a photoresist 240 is formed over the hard mask 230. The photoresist 240 illustrated in FIG. 2F has been patterned to form a mask to etch the orifices into the hard mask 230. In FIG. 2G the hard mask 230 is etched with an etchant to form openings in the hard mask 230 that will serve as the orifices of the microscale synthetic jets 100. The etched hard mask 230 will also serve as the hard mask for the etching of the chambers within the chamber material 220.

Figure 2H:
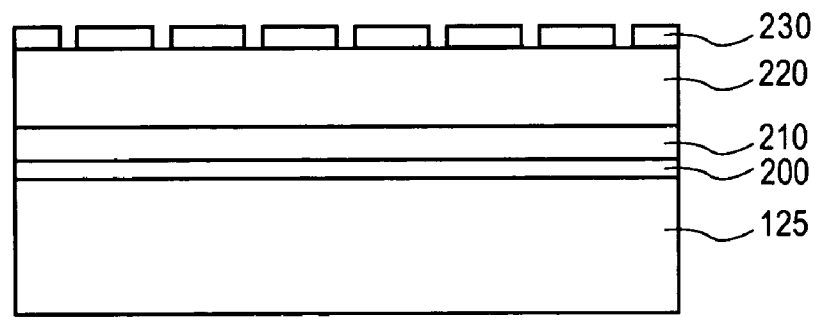
Figure 2I:
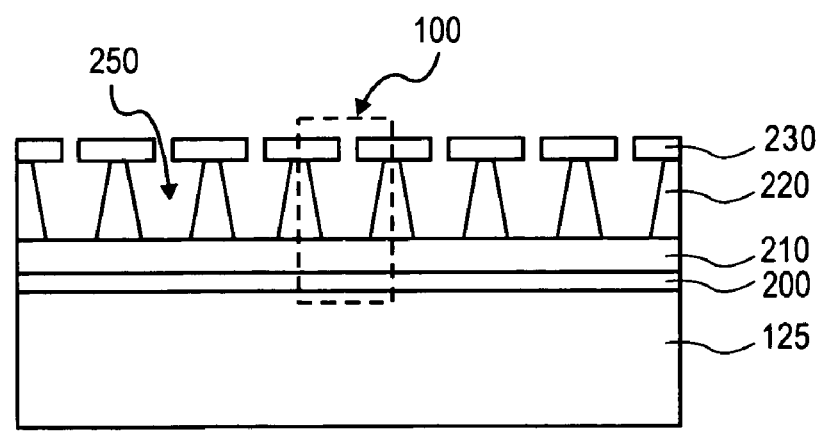

At FIG. 2H the photoresist 240 has been removed and the chamber material is anisotropically etched to form the chambers 250 as illustrated in FIG. 2I. An anisotropic wet etch such as potassium hydroxide may be used on a silicon chamber material 220. An anisotropically etched silicon chamber material 220 will form chambers having angled walls and will etch horizontally under the hard mask 230. The chambers 250 are etched vertically down to the actuator material 210. Through this method an array 105 of microscale synthetic jets 100 is formed on the backside of a heat generating component 125 of a computing device. Any number of microscale synthetic jets 100 may be within the array 105. The number of microscale synthetic jets may depend on the size of the jets themselves and the available surface area and whether the array is to only be formed over hot spots.

In an alternate embodiment, the synthetic jet array 105 may be formed by traditional machining techniques. In this embodiment, the chamber material may be formed of a metal and the chambers may be etched by traditional machining techniques, eliminating the need for a hard mask 230.

An array 105 of microscale synthetic jets 100 may be used to cool a computing device. In this embodiment, a heat generating component having an integrated microscale synthetic jet array 105 is energized. The jets within the microscale synthetic jet array are pulsed to force air away from a surface of the computing device to cool the computing device. In one embodiment, where a piezoelectric material is used as the actuator, the jets of air are created by pulsing the electrodes of the array 105 of microscale synthetic jets 100 with a radio-frequency signal to create an acoustic wave within the chamber to push air away from the heat generating component. The radio-frequency signal may be pulsed in the approximate range of 100 kilohertz (Hz) and 10 kilohertz (kHz) to the pair of electrodes of the array 105 of microscale synthetic jets 100 every 10 milliseconds (ms) to 100 microseconds (µs). In an alternate embodiment, an electrical current may be pulsed to the electrodes when the actuator is a shape memory material to create the jets of air. In one embodiment the pulsing of the jets of air may be started once the heat generating component has reached a temperature above a pre-determined threshold temperature and the pulsing of the jets of air may be stopped once the heat generating component has reached a temperature below the pre-determined threshold temperature.

In an embodiment, the hot air may be removed from the surface of the heat generating component by convection caused by the bulk air flow of the hot air away from the surface and the resultant influx of cooler air to the surface, as illustrated in FIG. 1B. In one embodiment a fan or an air jet may be positioned to flow the hot air away from the heat generating component once the array 105 of microscale synthetic jets 100 has pushed the hot air from the surface of the heat generating component.

Figure 3:
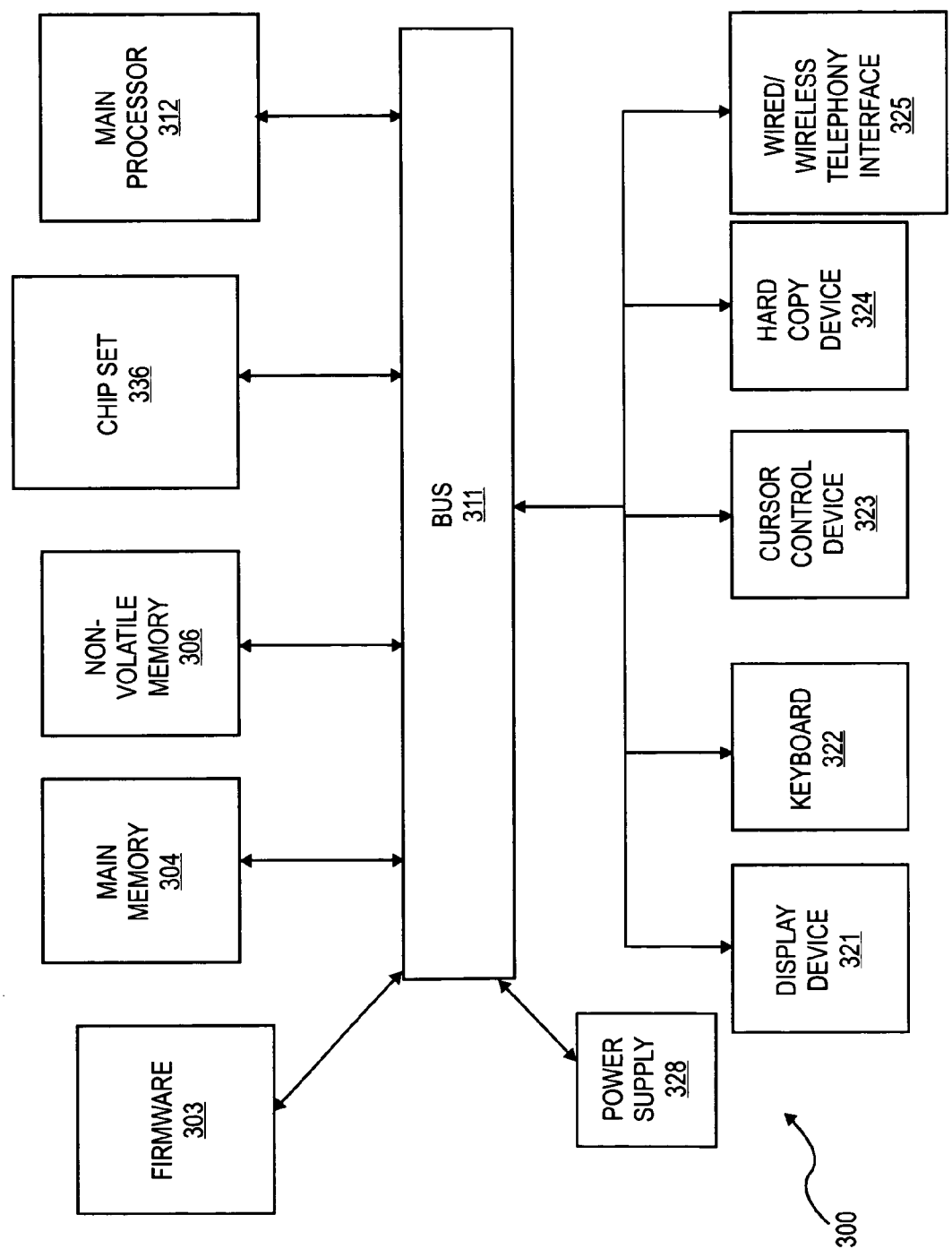
FIG. 3 presents a flow-chart of a method of cooling a heat generating component using an array of microscale synthetic jets.

FIG. 3 illustrates a block diagram of an example computer system that may use an embodiment of the synthetic jet array to cool the heat generating components within the computer system. In one embodiment, computer system 300 comprises a communication mechanism or bus 311 for communicating information, and an integrated circuit component such as a processor 312 coupled with bus 311 for processing information. One or more of the components or devices in the computer system 300 such as the processor 312 or a chip set 336 may be cooled by the synthetic jet array.

Computer system 300 further comprises a random access memory (RAM) or other dynamic storage device 304 (referred to as main memory) coupled to bus 311 for storing information and instructions to be executed by processor 312. Main memory 304 also may be used for storing temporary variables or other intermediate information during execution of instructions by processor 312.

Firmware 303 may be a combination of software and hardware, such as Electronically Programmable Read-Only Memory (EPROM) that has the operations for the routine recorded on the EPROM. The firmware 303 may embed foundation code, basic input/output system code (BIOS), or other similar code. The firmware 303 may make it possible for the computer system 300 to boot itself.

Computer system 300 also comprises a read-only memory (ROM) and/or other static storage device 306 coupled to bus 311 for storing static information and instructions for processor 312. The static storage device 306 may store OS level and application level software.

Computer system 300 may further be coupled to a display device 321, such as a cathode ray tube (CRT) or liquid crystal display (LCD), coupled to bus 311 for displaying information to a computer user. A chipset, such as chipset 336, may interface with the display device 321.

An alphanumeric input device (keyboard) 322, including alphanumeric and other keys, may also be coupled to bus 311 for communicating information and command selections to processor 312. An additional user input device is cursor control device 323, such as a mouse, trackball, trackpad, stylus, or cursor direction keys, coupled to bus 311 for communicating direction information and command selections to processor 312, and for controlling cursor movement on a display device 321. A chipset, such as chipset 336, may interface with the input output devices.

Another device that may be coupled to bus 311 is a hard copy device 324, which may be used for printing instructions, data, or other information on a medium such as paper, film, or similar types of media. Furthermore, a sound recording and playback device, such as a speaker and/or microphone (not shown) may optionally be coupled to bus 311 for audio interfacing with computer system 300. Another device that may be coupled to bus 311 is a wired/wireless communication capability 325.

Computer system 300 has a power supply 328 such as a battery, AC power plug connection and rectifier, etc.

In one embodiment, the software used to facilitate the routine can be embedded onto a machine-readable medium. A machine-readable medium includes any mechanism that provides (i.e., stores and/or transmits) information in a form accessible by a machine (e.g., a computer, network device, personal digital assistant, manufacturing tool, any device with a set of one or more processors, etc.). For example, a machine-readable medium includes recordable/non-recordable media (e.g., read only memory (ROM) including firmware; random access memory (RAM); magnetic disk storage media; optical storage media; flash memory devices; etc.), as well as electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. For example, the above described thermal management technique could also be applied to desktop computer device. The specification and drawings are, accordingly, to be regarded in an illustrative rather than a restrictive sense.

We claim:

1. A computing device, comprising:
   a heat generating component;
   a microscale synthetic jet to cool the heat generating component, the microscale synthetic jet further comprising:
   an electrode on the heat generating component;
   an actuator material over the electrode;
   a chamber material over the actuator material;
   an orifice and
   a chamber in the chamber material to form a microscale synthetic jet operable to expel air heated by the heat generating component away from the heat generating component; and
   a battery to power the computing device.

2. The computing device of claim 1, wherein the microscale synthetic jet comprises an array of microscale synthetic jets.

3. A method of fabricating a cooling device, comprising:
   forming an electrode on a heat generating component of a mobile device; depositing an actuator material over the electrode;
   depositing a chamber material over the actuator material;
   forming a hard mask material over the chamber material and patterning the hard mask material to form orifices of microscale synthetic jets;
   etching the chamber material, using the hard mask as a pattern, to form chambers of microscale synthetic jets operable to expel heated air away from the cooling device.

4. The method of claim 3, wherein etching the chamber material comprises anisotropically etching silicon.

5. The method of claim 3, wherein depositing an actuator material comprises depositing a piezoelectric material.

* * * * *